(12) United States Patent
Van Banning et al.

(10) Patent No.: US 11,385,556 B2
(45) Date of Patent: Jul. 12, 2022

(54) PARTICLE BEAM APPARATUS

(71) Applicant: ASML NETHERLANDS B.V., Veldhoven (NL)

(72) Inventors: Dennis Herman Caspar Van Banning, Best (NL); Jeroen Gerard Gosen, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/054,194

(22) PCT Filed: May 22, 2019

(86) PCT No.: PCT/EP2019/063203
§ 371 (c)(1),
(2) Date: Nov. 10, 2020

(87) PCT Pub. No.: WO2019/228884
PCT Pub. Date: Dec. 5, 2019

(65) Prior Publication Data
US 2021/0132513 A1    May 6, 2021

(30) Foreign Application Priority Data
May 28, 2018   (EP) .................................... 18174642

(51) Int. Cl.
*G03F 7/20* (2006.01)
*H01J 37/20* (2006.01)
*H01J 37/317* (2006.01)

(52) U.S. Cl.
CPC ...... *G03F 7/70875* (2013.01); *G03F 7/70525* (2013.01); *G03F 7/70716* (2013.01);
(Continued)

(58) Field of Classification Search
CPC ............. G03F 7/70875; G03F 7/70525; G03F 7/70716
(Continued)

(56) References Cited

U.S. PATENT DOCUMENTS 5,856,906 A    1/1999  Kholodenko et al.
6,496,350 B2 *  12/2002  Fujiwara ................ B23Q 3/154
                                              361/128
(Continued)

FOREIGN PATENT DOCUMENTS

JP       2006049919       2/2006

OTHER PUBLICATIONS

International Search Report and Written Opinion issued in corresponding PCT Patent Application No. PCT/EP2019/063203, dated Aug. 9, 2019.
(Continued)

*Primary Examiner* — Hung V Nguyen
(74) *Attorney, Agent, or Firm* — Pillsbury Winthrop Shaw Pittman LLP

(57) ABSTRACT

An apparatus having: a vacuum chamber for enclosing an article support, the article support configured to support an article such that a volume is defined between the article support and the article, the article support including a plurality of supporting protrusions configured to provide a plane of support for the article; a conduit for providing a fluid to the volume such that the fluid provides heat transfer between the article and the article support; and a controller for controlling the fluid supply to the volume, wherein the controller is configured to control a fluid supply unit to start removing the fluid substantially at a time the article reaches a stable temperature.

20 Claims, 3 Drawing Sheets

(52) U.S. Cl.
CPC .......... *H01J 37/20* (2013.01); *H01J 37/3174* (2013.01); *H01J 2237/2001* (2013.01)

(58) Field of Classification Search
USPC ...................................... 250/492.2
See application file for complete search history.

(56) References Cited

U.S. PATENT DOCUMENTS

| | | |
|---|---|---|
| 2002/0067585 A1 | 6/2002 | Fujiwara |
| 2005/0128463 A1 | 6/2005 | Ottens et al. |
| 2011/0128517 A1* | 6/2011 | Ottens .............. H01L 21/67248 355/30 |

OTHER PUBLICATIONS

European Search Report and Written Opinion issued in corresponding European Patent Application No. 18174642.1, dated Dec. 11, 2018.

* cited by examiner

PARTICLE BEAM APPARATUS

CROSS-REFERENCE TO RELATED APPLICATIONS

This application is the U.S. national phase entry of PCT Patent Application No. PCT/EP2019/063203, which was filed May 22, 2019, which claims the benefit of priority of European patent application no. 18174642.1 which was filed on May 28, 2018 and which is incorporated herein in its entirety by reference.

FIELD

The present invention relates to a particle beam apparatus, to a lithographic apparatus, and to related methods and components. The particle beam apparatus may be an electron beam inspection apparatus.

BACKGROUND

In the semiconductor processes, defects are inevitably generated. Such defects may impact device performance even up to failure. Device yield may thus be impacted, resulting in increased costs. In order to control semiconductor process yield, defect monitoring is important. One tool useful in defect monitoring is an SEM (Scanning Electron Microscope) which scans a target portion of a specimen using one or more beams of electrons.

During operation of an inspection tool, the substrate is typically held by a substrate table. The inspection tool will typically comprise a substrate positioning device for positioning the substrate table and substrate relative to the e-beam. This may be used to position a target area on the substrate, i.e. an area that needs to be inspected, in an operating range of the e-beam. The substrate and the substrate table may be at a different temperature when the substrate is loaded onto the substrate table. Thus, there is heat transfer between the substrate and the substrate table after the substrate has been loaded onto the substrate table. This heat transfer may cause a deformation of the substrate (and/or the substrate table). During such a deformation, i.e. while the substrate table or substrate is undergoing a thermal deformation, e.g. a thermal expansion, the inspection of the target area may not be possible or may have a reduced accuracy.

Once the substrate table and substrate have reached a thermal equilibrium, the substrate table and substrate will substantially maintain their shape and size and the inspection process will no longer be affected by thermal expansion. Thus, to perform accurate inspection it may be necessary to wait for a significant period of time before inspection can commence. This reduces the throughput of the inspection apparatus.

SUMMARY

According to a first aspect of the present invention, there is provided an apparatus comprising;
a vacuum chamber for enclosing an article support;
the article support configured to support an article such that a volume is defined between the article support and the article, the article support comprising a plurality of supporting protrusions configured to provide a plane of support for the article;
a conduit for providing a fluid to the volume such that the fluid provides heat transfer between the article and the article support; and
a controller for controlling the fluid supply to the volume, wherein the controller is configured to control a fluid supply unit to start removing the fluid substantially at a time the article reaches a stable temperature.

This may have an advantage that the fluid being provided to the volume increases the rate of heat transfer between the article and article support which in turn decreases the amount of time needed for the substrate to adjust in temperature towards the article support. This may allow the particle beam to be turned on quicker. This may improve throughput of the particle beam apparatus. This may have an advantage that the vacuum level within the vacuum chamber may be maintained at a desired level. Backfill fluid can be used in a chamber with a relatively high vacuum.

The stable temperature may comprise a temporal and/or spatial temperature variation smaller than 1 mK, 10 mK, 100 mK, or 1 K.

The vacuum chamber may be a process chamber where the article is placed or a transfer chamber for transferring the article to a process chamber.

The particle beam apparatus may further comprise a pump for providing the fluid to the volume and/or for removing fluid from the volume.

The pump may be a first pump for pumping the fluid to the volume and a second pump for pumping the fluid from the volume.

The fluid may be a gas or liquid.

The controller may be configured to control the fluid supply to supply the fluid until the article reaches a stable temperature.

The controller may be configured to control the fluid supply to supply the fluid substantially immediately after the article is supported by the article support.

The controller may be configured to control the fluid supply such that fluid is removed from the volume for a specific period of time.

The controller may be configured to control the fluid supply to stop supplying the fluid and then to control the fluid supply such that fluid is remove from the volume.

The article support may comprise a clamp for clamping the article onto the support structure.

The clamp may be an electrostatic clamp or a mechanical clamp.

The article may be a patterning device. The article may be a lithographic substrate.

The apparatus may be one of a particle beam apparatus, an electron beam apparatus, an electron beam inspection apparatus, a lithographic apparatus or a transfer apparatus.

According to a second aspect of the invention, there is provided a method of performing thermal conditioning of an article in a vacuum chamber comprising: supplying fluid to a volume between the article and an article support which supports the article, the fluid providing heat transfer between the article and the article support, the article support comprising a plurality of supporting protrusions which provide a plane of support for the article; and starting to remove the fluid substantially at a time the article reaches a stable temperature.

The stable temperature may comprise a temporal and/or spatial temperature variation smaller than 1 mK, 10 mK, 100 mK, or 1 K.

The method may further comprise supplying the fluid intermittently whilst the article is supported by the article support.

The method may further comprise supplying the fluid until the article reaches a stable temperature.

The method may further comprise supplying the fluid substantially immediately after the article is supported by the article support.

The method may further comprise removing the fluid from the volume for a specific period of time.

The method may further comprise removing the fluid from the volume after stopping the supplying of the fluid.

The fluid may be a gas.

The method may further comprise supplying the gas for a period between 1 minute and 2 minutes.

The method may further comprise removing the gas from the volume for a period between 10 seconds and 20 seconds.

According to a third aspect of the present invention, there is provided an apparatus according to the first aspect of the present invention wherein the apparatus is a particle beam apparatus comprising: a particle beam generator configured to generate a particle beam to irradiate the article; and a further controller for controlling the particle beam generator, wherein the further controller is configured to control the particle beam generator to irradiate the particle beam to the article if a pressure inside the volume is below a specific value.

According to a fourth aspect of the present invention, there is provided an apparatus according to the first aspect of the present invention wherein the apparatus is one of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus or a transfer apparatus.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "beam" may also refer to a particle beam such as an electron beam.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
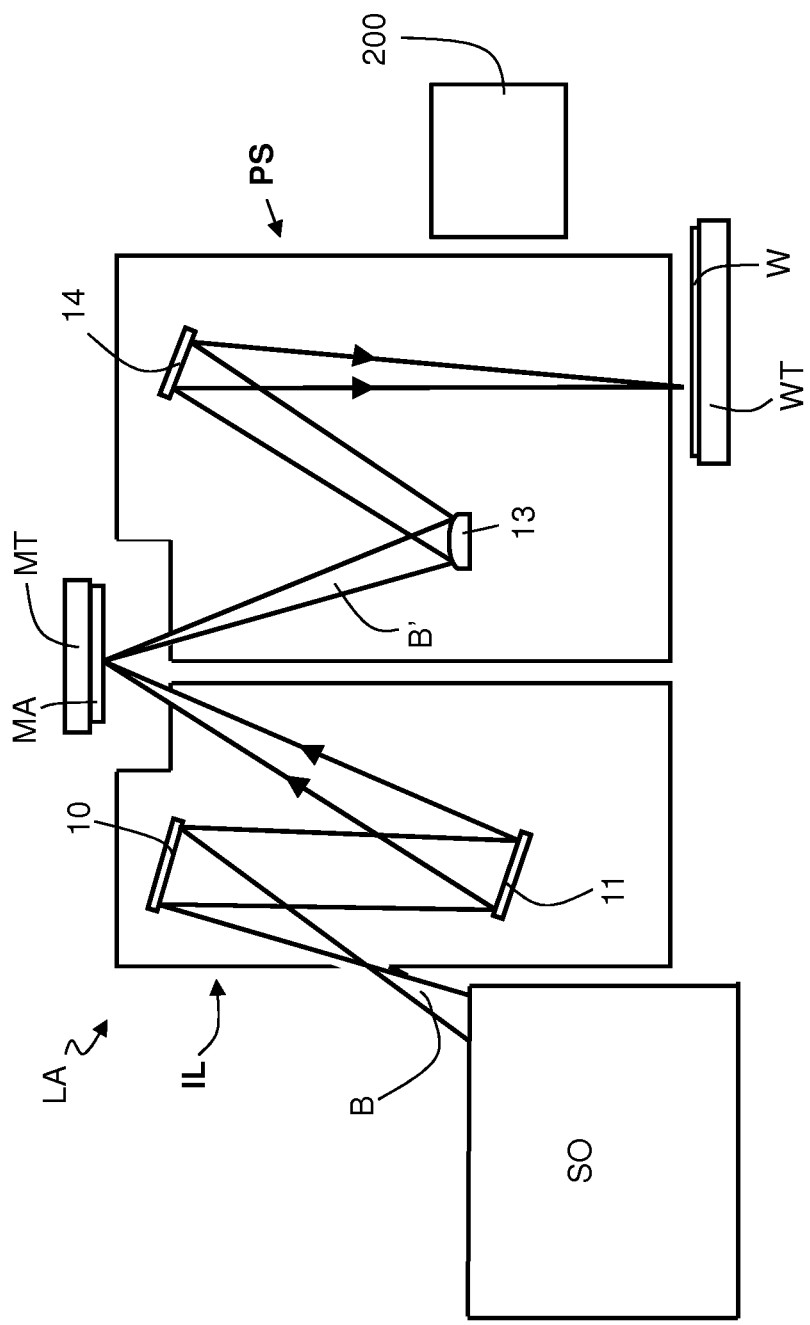
FIG. 1 depicts a schematic overview of a lithographic apparatus according to an embodiment of the invention.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT (e.g. a wafer table) configured to support a substrate W (e.g. a wafer).

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

FIG. 1 shows an electron beam (e-beam) inspection apparatus 200 which is connected to the lithographic apparatus LA (i.e. in track). The e-beam inspection apparatus 200 may be configured to inspect the substrate W on the substrate table WT in the lithographic apparatus. That is, inspection occurs in production (in-line). In other examples, the e-beam inspection apparatus 200 may be located external to the lithographic apparatus LA. That is, the e-beam inspection apparatus 200 may be a stand-alone system for inspecting articles. The reminder of the description will be concerned with the e-beam inspection apparatus but it will be appreciated that the e-beam inspection apparatus may be included within the lithographic apparatus LA to inspect any articles in the lithographic apparatus LA as required. Although FIG. 1 depicts an EUV lithographic apparatus, the e-beam inspection apparatus may be used in a lithographic apparatus using other wavelengths of radiation, such as DUV (deep ultra-violet).

An inspection apparatus is used to determine one or more properties of a substrate W. The inspection apparatus may be integrated into the lithographic apparatus LA or a lithocell LC or may be a stand-alone device.

Inspection apparatus to determine one or more properties of an article (such as a semiconductor substrate, patterning device, etc.) can take various different forms. For example, the inspection apparatus may use photon electromagnetic radiation to illuminate the article and detect radiation redirected by the article; such inspection apparatuses may be referred to as bright-field inspection apparatuses. A bright-field inspection apparatus may use radiation with a wavelength in, for example, the range of 150-900 nm. The inspection apparatus may be image-based, i.e., taking an image of the article, and/or diffraction-based, i.e., measuring intensity of diffracted radiation. The inspection apparatus may inspect product features (e.g., features of an integrated circuit to be formed using a substrate or features of a mask) and/or inspect specific measurement targets (e.g., overlay targets, focus/dose targets, CD gauge patterns, etc.).

Inspection of, e.g., semiconductor wafers is done mostly with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. So, future semiconductor nodes challenge the scalability of current optical inspection for measuring small defects (e.g., pattern shape defects, electrical defects, etc.) and to measure the smaller and/or denser features of those nodes, due to the resolution limits of bright-field inspection. Further, bright-field inspection can have relatively lower capture rate and/or, for a given capture rate, an increasing nuisance rate, which can lead to increased time and costs spent using bright-field inspection.

Accordingly, a higher resolution inspection technique is used and desired. An example inspection technique is electron beam inspection using an electron beam (e-beam) inspection apparatus. Electron beam inspection involves focusing a beam of electrons on a small spot on the article to be inspected. An image is formed by providing relative movement between the beam and the article (hereinafter referred to as scanning the electron beam) over the area of the article inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) on the article.

In the context of this application, the "article" may be any of a wafer, reticle, mask, or substrate. The "article" may be a substrate to be processed in manufacturing devices employing lithographic projection techniques. The article may be a lithographic projection mask (or reticle) or mask blank in a lithographic projection apparatus, a mask handling apparatus such as mask inspection or cleaning apparatus, or in a mask manufacturing apparatus. The article may be any other article or optical element that is clamped in the light path of the radiation system or may be clamped in the electron beam path of the electron beam inspection apparatus (or the path of some other particle beam).

Figure 2:
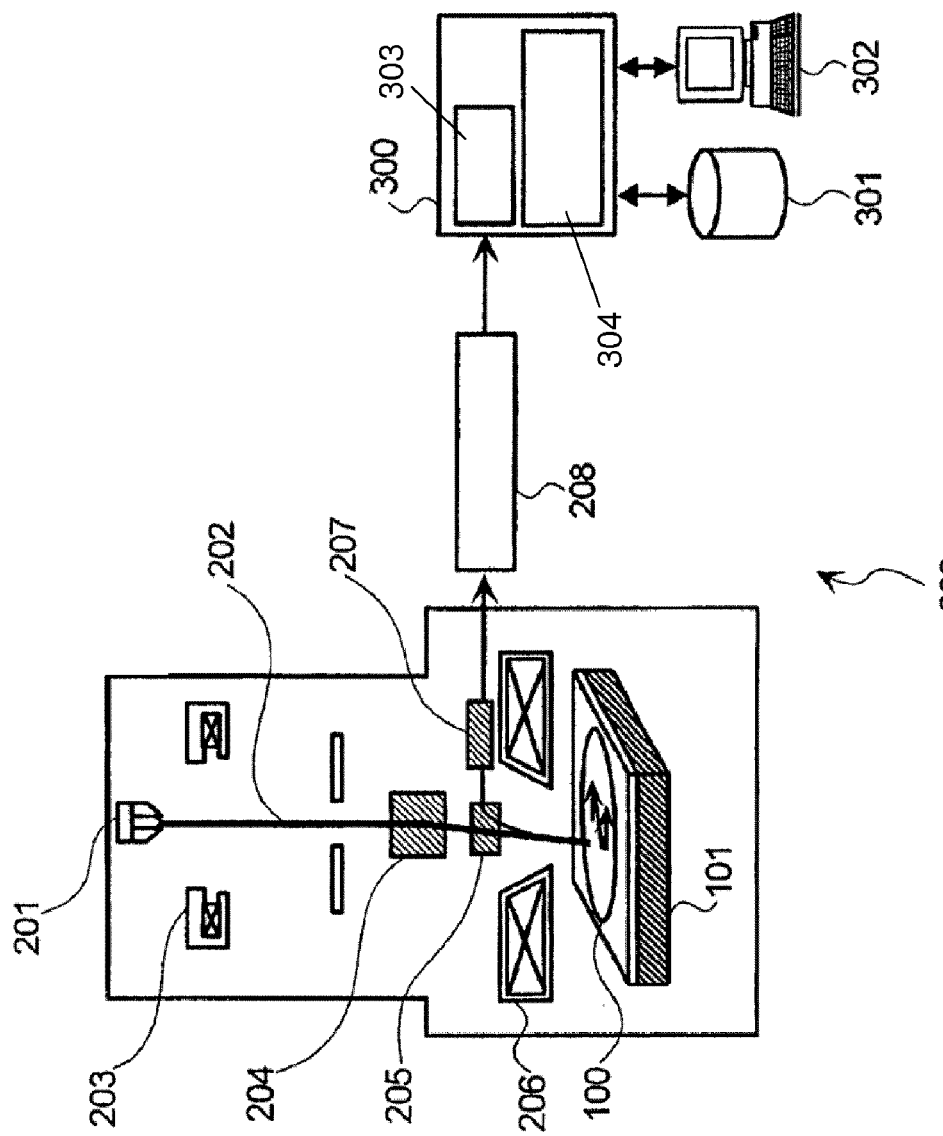
FIG. 2 depicts a schematic overview of an electron beam inspection apparatus according to an embodiment of the invention.

FIG. 2 depicts an embodiment of the electron beam inspection apparatus 200. A primary electron beam 202 emitted from an electron source 201 is converged by condenser lens 203 and then passes through a beam deflector 204, an E×B deflector 205, and an objective lens 206 to irradiate an article 100 (e.g. a substrate W), on a table 101 (e.g. a substrate table WT) at a focus. That is, the electron beam inspection apparatus 200 includes an electron beam column which is configured to provide an electron beam and detect scattered or secondary electrons from the article 100 placed in a beam path of the electron beam.

When the article 100 is irradiated with electron beam 202, secondary electrons are generated from the article 100. The secondary electrons are deflected, e.g. by an E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the article 100 by the table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

The apparatus depicted in FIG. 2 is an example of a single electron beam column inspection system, i.e. it has a single electron beam column that produces, controls and detects a single electron beam. But, a single electron beam column inspection system can take a long time to inspect an article, such as a standard 300 mm wafer. This can be further exacerbated by the desire to measure smaller defects and/or features, which require a smaller beam size. Using smaller beam or pixel sizes to detect smaller defects and/or features may lead to noise and loss in throughput (e.g., due to reducing the electron current to limit any damage to the article). Increased electron current can increase throughput but has repercussions on resolution.

Throughput (e.g., inspection area per unit time) can be increased by providing a plurality of electron beams from a particular electron beam column (a multi-beam column). Furthermore, multiple beams of a multi-beam column electron beam inspection system may be implemented in the context of an article 100 (e.g., a semiconductor wafer, a reticle, etc.).

Throughput of the multi beam electron beam inspection apparatus is limited by the time it takes the article 100 to reach thermal equilibrium with the article table 101.

Figure 3:
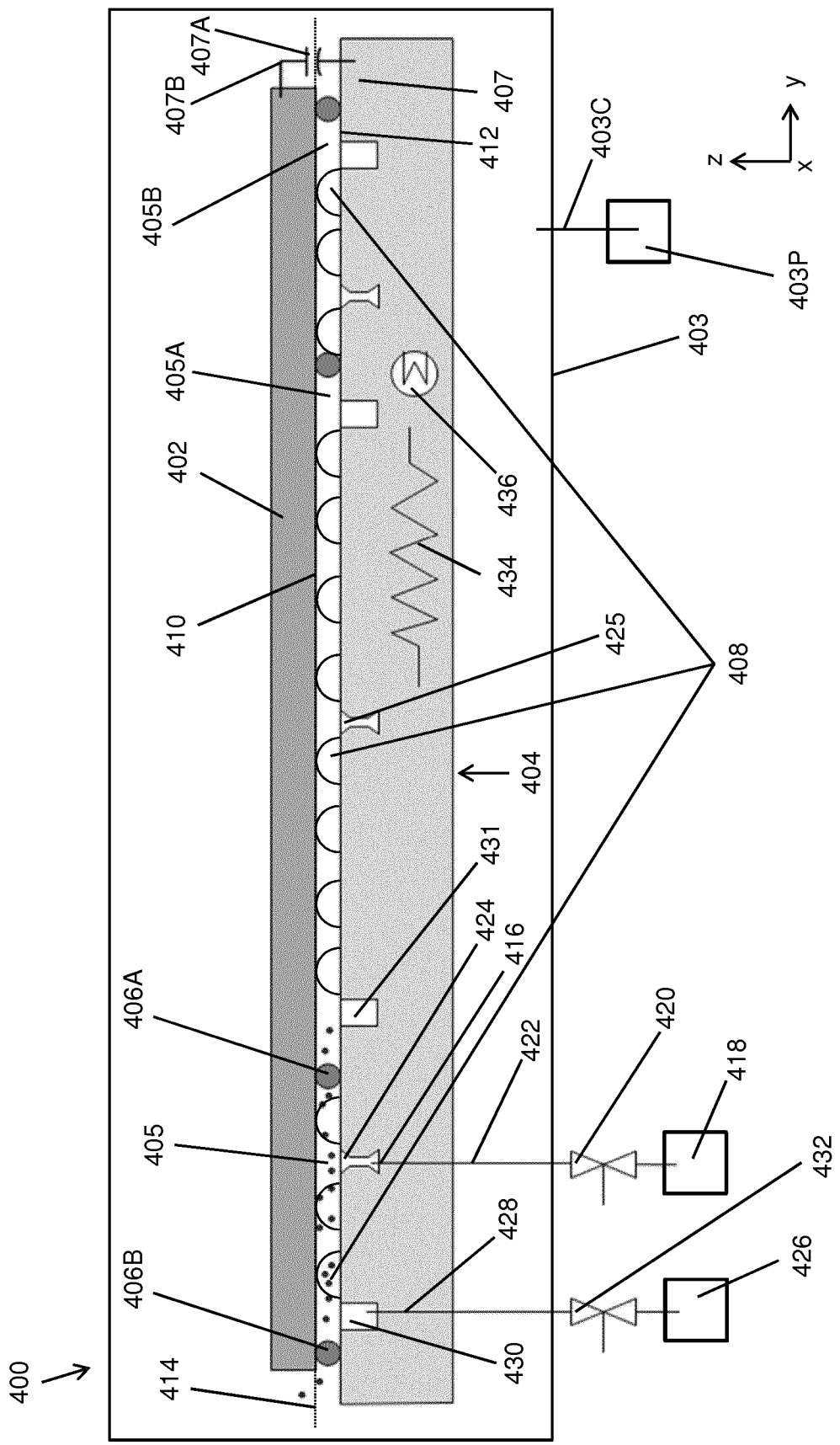
FIG. 3 depicts a schematic overview of a substrate and substrate table in an electron beam inspection apparatus according to an embodiment of the invention.

FIG. 3 shows a sectional side view of an embodiment of an article, which in this exemplary case is a substrate 402, and an article support (e.g. table), which in this exemplary case is a substrate table 404, of an electron beam inspection apparatus 400. The process chamber 403 is the chamber where the substrate 402 is placed in the electron beam path. The process chamber 403 is a vacuum chamber. A pump, such as a turbo pump 403P, is connected to the process chamber 403 via a connection 403C in order to maintain the vacuum level in the process chamber 403 at the desired level. The turbo pump 403P may be on constantly. The vacuum level in the process chamber 403 may be 5 e−7 Torr (6.67 e−5 Pa) during inspection of the substrate 402. The turbo pump 403P may maintain the vacuum level below 2 e−6 Torr (2.67 e−4 Pa). This is because this is the gas pressure required at which the high voltage for the e-beam inspection can be safely turned on. If the gas pressure is not at least at this level, or below, then there is a danger of arcing due to the high voltage. In other examples, the pump may be a different type of pump from a turbo pump as long as it is suitable for establishing a vacuum in the chamber.

The substrate table 404 and the substrate 402 may be in a process chamber 403 of the e-beam inspection apparatus 400. The substrate table 404 receives and supports the substrate 402 such that a volume 405 is defined between the substrate table 404 and the substrate 402. Two O-rings, an inner O-ring 406A and an outer O-ring 406B located concentrically with each other, are located between the substrate table 404 and the substrate 402. The volume 405 is further defined by the outer O-ring 406B. The two O-rings 406A, 406B define segmented compartments 405A, 405B which allow differential pumping as will be described in more detail later. This makes the pumping away of the gas more efficient. The outer O-ring 406B is located close to the edge of the substrate 402 with the inner O-ring 406A towards the centre of the substrate 402 with respect to the outer O-ring 406B. However, in other examples, the volume may extend across substantially all of the substrate 402. The volume may have different dimensions as long as it is defined between the substrate table 404 and the substrate 402.

The substrate table 404 positions the substrate 402 underneath the e-beam from the electron beam column (not shown) of the electron beam inspection apparatus 400 for measurements. The substrate table 404 typically makes X, Y point-to-point movements in the horizontal plane.

The substrate table 404 is operating under vacuum, e.g. inside a vacuum chamber. This is because the e-beam inspection apparatus 400 requires a vacuum to carry out the e-beam inspection. The substrate table 404 comprises an electrostatic clamp 407. The electrostatic clamp 407 may be part of or comprised in the substrate table 404. In other examples, the electrostatic clamp 407 may be separate to the substrate table.

The electrostatic clamp 407 holds the substrate 402 to the substrate table 404 during movement via an electric charge. A power source 407A provides the electric charge through electrical wires 407B connecting the substrate 402 to the electrostatic clamp 407.

A plurality of burls 408 (i.e. supporting protrusions) extend upwardly from a planar surface 412 of the substrate table 404. The burls 408 define a plane of support 414 for the substrate 402. In this example, the burls 408 are spaced across the planar surface 412 of the substrate table 404. In some examples, each of the burls may be spaced equidistantly from their adjacent burl. The burls 408 prevent particles causing uneven clamping between the substrate 402 and the substrate table 404, i.e. the burls 408 help the substrate 402 to be flat when attached to the substrate table 404. The burls 408 have rounded tops but in other examples, the burls may have any suitable shape. The burls 408 are provided as a two dimensional array to support the substrate 402 across its surface 410. It will be appreciated that in examples the substrate table 404 may comprise any number of burls. In other examples, there may be a single protrusion between the substrate and the electrostatic clamp, e.g. a protrusion in the shape of a ring or square. In other examples, there may be an array with a number of burls spaced around the circumference of the substrate table 404 with a central portion absent of burls.

The substrate 402 is clamped against the burls 408 with an electrostatic charge provided from the electrostatic clamp 407, i.e. the substrate 402 is pulled against the burls 408. In other words, the substrate 402 may be held in the plane 414 by an electrostatic clamping force when a voltage is applied. However, because of the shape of the burls 408, there will be only limited physical contact between the burls 408 and the substrate 402. That is there are gaps between the substrate 402 and the burls 408 which results in limited physical contact, i.e. less thermal conduction than full contact. The clamping force is a key parameter in determining the contact area between the substrate 402 and the burls 408.

Heat transfer between the substrate 402 and the electrostatic clamp 407 consists of conduction and radiation. For a high heat transfer coefficient, conduction should be the dominant heat transfer mechanism. The heat transfer will determine the amount of time needed for the substrate 402 to adjust in temperature towards the electrostatic clamp 407. That is, the time for the substrate 402 to reach a stable temperature. A stable temperature may be a setpoint at approximately 22° C. In other examples, the stable temperature may be a setpoint within a range of 18-24° C. A temperature may be considered to be stable when any deviations from the setpoint are less than 30 mK. When the substrate 402 has reached a stable temperature, the substrate 402 and the electrostatic clamp 407 will be in thermal equilibrium. Bringing the substrate 402 to a stable temperature may be considered to be (thermal) conditioning the substrate 402. Temperature deviations considered to be a stable temperature may vary for different applications (e.g. lithographic apparatus, metrology apparatus, inspection apparatus), different requirements (e.g. positioning precision requirement of the substrate 402), different thermal environments (e.g. presence of heat loads/sinks around the substrate 402), material properties of different substrate material (e.g. thermal expansion coefficient of the substrate 402), different configurations of the apparatus (e.g. design of the substrate clamp), etc. For example, a temporal and/or spatial temperature variation of 1 mK, 10 mK, 100 mK, 1 K or higher may be regarding as a stable temperature depending on the applications.

The e-beam inspection apparatus 400 comprises a conduit 416 for feeding (e.g. supplying or providing) gas (which may be referred to as backfill gas) from a gas pump 418 into the volume 405. The gas may be e.g. nitrogen, hydrogen or helium. There is a valve 420 located between the gas pump 418 and the volume 405. The conduit 416 comprises a gas tube 422 and a channel 424, the gas tube 422 running from the gas pump 418 to the channel 424 formed in the substrate table 404. The channel 424 opens into the volume 405 and gas flowing into the channel 424 from the gas tube 422 will exit into the volume 405. More particularly, the channel 424 opens up into the segmented compartment 405B between the inner and outer O-rings 406A, 406B. The channel 424 is open and runs circularly around the full substrate table 404.

There is also provided a central channel 425 which is also fed gas by the gas pump 418 through the conduit 416, although the connections are not shown. The central channel 425 opens up into the volume 405 and thus gas can be fed through the conduit 416 into the volume 405. More particularly, the central channel 425 opens up into the segmented compartment 405A defined by the inner O-ring 406A. In this example, the central channel 425 is a single opening located in the centre of the substrate table 404.

The gas pressure in the volume 405 may be in a range of 100-800 Pa. In other examples, the range of gas pressure in the volume may be wider. In other examples, the gas channels may extend only part way around the substrate table. In other examples, the gas channel may have a single or a plurality of openings to the volume and the openings may be spaced around the substrate table, e.g. a number of holes around the circumference. In other examples, liquid may be used instead of gas to flow into the volume. Using a liquid may provide improved heat transfer (e.g. thermal conduction) when compared with using a gas. However, using a gas allows the desired vacuum level to be met quicker than if using a liquid. More generally, a fluid may be fed into the volume.

A vacuum pump 426 is provided to remove gas from the volume 405 and establish a vacuum in the volume 405. More generally, the vacuum pump 426 may be a pump that is configured to remove gas from the volume 405. In some examples, the gas pump and the vacuum pump could be the same pump, or at least use the same supply line. That is, the pump may be configured to pump gas to the volume and pump gas from the volume.

The vacuum pump 426 is in communication with the volume 405 through a vacuum tube 428 and a vacuum channel 430. The vacuum channel 430 is located near the edge of the substrate 402, i.e. further away from the centre of the substrate 402 than the channel 424. There is a valve 432 located between the vacuum pump 426 and the volume 405. The vacuum channel 430 opens into the volume 405 and gas will flow into the channel 424 from the volume 405. More particularly, the vacuum channel 430 opens up into the segmented compartment 405B between the inner and outer O-rings 406A, 406B. The vacuum channel 430 is open and runs circularly around the full substrate table 404.

There is also provided a central vacuum channel 431 from which gas is also able to be removed from the volume 405, although the connections are not shown. The vacuum channel 431 is located near the inner O-ring 406A, i.e. further away from the centre of the substrate 402 than the channel 425. The central vacuum channel 431 opens up into the volume 405 and thus gas can be fed from the volume 405. More particularly, the central vacuum channel 431 opens up into the segmented compartment 405A defined by the inner O-ring 406A. The vacuum channel 431 is open and runs circularly around the full substrate table 404. In other examples, the vacuum channels may extend only part way around the substrate table. In other examples, the vacuum channels may have a single or a plurality of openings to the volume the openings may be spaced around the substrate table, e.g. a number of holes around the circumference.

The substrate table 404 may include a heater 434. The substrate table 404 may include a heat sink 436. These are for increasing or decreasing the temperature of the substrate table 404 respectively which can in turn affect the temperature of the substrate 402.

The gas is provided to the volume 405 through the conduit 416 and the gas in the volume 405 provides heat transfer between the substrate 402 and the electrostatic clamp 407 (and thus the substrate table 404). The heat transfer between the substrate 402 and the electrostatic clamp 407 through the gas in the volume 405 may be by conduction and/or convection. The heat transfer between the substrate 402 and the electrostatic clamp 407 is improved when compared to a system without the gas being present in the volume 405 (i.e. the volume being at substantially vacuum pressure). Therefore, the gas being provided to the volume 405 increases the rate of heat transfer between the substrate 402 and the electrostatic clamp 407 which in turn decreases the amount of time needed for the substrate to adjust in temperature towards the electrostatic clamp 407. This may improve throughput of the electron beam inspection apparatus.

Once the substrate 402 has reached a stable temperature, and can thus be inspected, the feeding of the gas to the volume 405 is stopped. That is, feeding the gas to the volume 405 through the conduit 416 is discontinued. The feeding of the gas may be controlled by a controller (not shown) which may be configured to turn the gas pump 418 on or off at desired times. Once the gas is stopped flowing to the volume 405, the vacuum pump 426 may be started to remove the gas from the volume 405. This is because a level of vacuum is required in order to carry out the e-beam inspection of the substrate 402.

In an embodiment of the present invention, feeding of the gas to the volume 405 may be stopped before the substrate 402 reaches a stable temperature. In this embodiment, the gas may be removed after the substrate 402 reaches a stable temperature. The vacuum pump 426 may start to remove the gas from the volume 405 even before the substrate 402 reaches the stable temperature. As it takes a certain period of time to remove the gas from the volume 405 and the heat transfer between the substrate 402 and the gas continues during the gas being removed from the volume 405, the substrate 402 may reaches a stable temperature during or shortly after the gas is removed from the volume 405. In an embodiment of the present invention, the vacuum pump 426 may start to remove the gas from the volume 405 even before the substrate 402 reaches the stable temperature and while the feeding of the gas to the volume 405 continues.

As mentioned before, to allow e-beam inspection to occur, the turbo pump 403P is operated continuously to maintain a required level of vacuum in the process chamber 403 (i.e. outside the volume 405 defined by the outer O-rings 406B). However, some of the gas may leak past the O-rings 406B to escape into the process chamber 403. Some gas may also leak past inner O-ring 406A into the space between the inner O-ring 406A and the outer O-ring 406B. When the gas flow to the volume 405 is turned off, the turbo pump 403P will have to recover the vacuum, but that will take time depending on the amount of gas that has leaked past the O-ring 406B. In order to keep the amount of gas released into the process chamber 403 from the volume 405 minimized, the gas is pumped out of the volume 405 by the vacuum pump 426 as described above. Thus, the O-rings 406A, 406B, the segmented compartments 405A, 405B in the volume 405 and the vacuum channels 430, 431 leading to the vacuum pump 426 allow differential pumping to reduce gas leakage to the process chamber 403. The location of the vacuum channel 430 and the central vacuum channel 431 near the outer O-ring 406B and the inner O-ring 406A, with respect to the channel 424 and the central channel 425, also helps reduce gas leakage to the process chamber 403.

Once the vacuum pressure has reached a required level for e-beam inspection to begin, the vacuum pump 426 may be stopped. The vacuum pressure in the process chamber 403 may be in a range of $6\,e^{-5}$ Pa to $3\,e^{-4}$ Pa. The gas may be pumped away from the volume 405 for 10 seconds or more. The gas may be pumped away from the volume for up to 20 seconds. Pumping the gas away for these timescales provides the required level of vacuum in the volume 405 such that the required level of vacuum can be achieved in the process chamber 403. In other examples, the gas may be pumped away from the volume for different times as long as the desired level of vacuum for inspection can be achieved. More generally, the gas may be pumped away from the volume 405 for a specific period of time. The controller may be configured to turn the vacuum pump 426 on or off at desired times. Once the vacuum pump 426 has stopped, the electron beam may be switched on to inspect the substrate 402. The vacuum pump 426 may be stopped because it can give a backstream if the vacuum in the process chamber 402 is at too low a pressure.

The electron beam from the electron beam column is collided into the substrate 402 at the desired location. Scattered or secondary electrons are then detected from the substrate 402 using the electron beam column, i.e. electron beam detector. The results can then be reviewed to determine if there are any defects etc. in the substrate 402. In other examples, the vacuum pump 426 may be on (i.e. pumping) for all or part of the time that the substrate 402 is being inspected.

Although in the examples described, the gas flow is stopped and started (both to and from the volume) by switching off and on gas pumps, in other examples, the gas flow can be stopped and started by allowing and preventing gas flow through the conduits in another way, such as by e.g. closing valves etc. Thus, the gas feed to the volume may be controlled by switching off and on gas pumps or by closing valves etc. The gas feed may be controlled by the controller. In other examples, the gas feed away from the volume may also be controlled by the controller.

In some examples, one or both the O-rings 406A, 406B may not provide a gas tight seal. This means that gas may leak past the O-rings 406A, 406B to outside the volume 405, i.e. into the process chamber 403. In some examples, the vacuum pump 426 may be on (i.e. pumping) for some or all of the time that the gas pump 418 is on (i.e. pumping) in order to subtract some of the gas and thus preserve a level of vacuum in the process chamber 403. This may be to stop some, or a majority, of the gas flowing past the O-rings 406A, 406B into the process chamber 403.

In some examples, the feeding of the gas to the volume 405 begins when the substrate 402 is received by the substrate table 404. That is, the gas is fed substantially immediately after the substrate 402 is received by the substrate table 404. This is so that the gas can assist in the conditioning of the substrate 402 as soon as possible.

The feeding of the gas may only be for a relatively short amount of time. The feeding of the gas may be for a period of time substantially shorter than the time the substrate 402 is supported by the substrate table 404. The term "supported" may be considered to mean received, clamped, held, etc. That is, the gas is not fed for the whole time the substrate 402 is supported by the substrate table 404. This is because a continuous gas flow may make the required vacuum level for electron beam inspection difficult to achieve. The substrate 402 is generally supported by the substrate table 404 for a time long enough for the inspection of the substrate 402 to occur and then another substrate is loaded onto the substrate table 404. The time that a substrate 402 is supported by the substrate table 404 includes the time required for the substrate 402 to reach a stable temperature and the time it takes for the e-beam column to carry out the desired inspection. The gas is only fed until the substrate 402 reaches a stable temperature. Once the substrate 402 reaches a stable temperature, the gas is switched off. The gas may be fed for 1 minute to 2 minutes. The gas may be fed for at least 1 minute and/or up to 2 minutes. Feeding the gas for these exemplary timescales may allow the thermal conditioning of the substrate 402 to be achieved. These timings may also be related to the location in which the conditioning occurs. In other examples, the gas may be fed for less time or for longer than this. In other examples, the gas may be fed for less than 1 minute. In some examples, the sequence of feeding the gas into the volume 405, stopping the gas feed, then pumping gas out of the volume 405 till the vacuum in the process chamber 403 is at a level for e-beam inspection to occur may be less than 1 minute. In these examples, the turbo pump 403P is operating continuously to pump gas from the process chamber 403.

The amount of time needed for the substrate 402 to adjust in temperature towards the electrostatic clamp 407 is calculated by the following Equation 1:

$$\tau = \frac{m \cdot Cp}{h \cdot A}$$

τ is the time taken; m is the mass of the substrate; Cp is the specific heat of the substrate (e.g. silicon); h is the heat transfer coefficient; A is the substrate surface area.

As an example for a previous electrostatic clamp, i.e. with no gas in the volume between the substrate and the electrostatic clamp, $h=4.5$ W/m$^2$K. Using this value for h and $m=0.128$ kg, Cp(silicon)$=713$ J/kgK, $A=0.07$ m$^2$ in Equation 1; $\tau=289.73$ secs.

Conventionally 3τ is used for a stable situation. In this case, $3\tau=14.49$ mins. Thus, approximately 15 mins are required to condition the substrate previously.

However, as an example, when using the gas in the volume 405, the heat transfer coefficient (h)$=200$ W/m$^2$K. Thus, the heat transfer coefficient has been improved from h=approximately 5 W/m$^2$K to 200 W/m$^2$K. This means that, using the same values as in the above calculation, and only substituting the new value for h; $\tau=6.52$ secs. Again using 3τ for a stable situation: $3\tau=19.58$ secs. Thus, only approximately 20 secs are required to condition the substrate 402 with the gas in the volume 405.

It will be appreciated that the use of the gas in the volume 405 greatly reduces the time it takes to condition the substrate 402 (i.e. for the substrate 402 to reach a steady temperature).

The increase in speed of the substrate 402 reaching thermal equilibrium means that the inspection by the e-beam inspection apparatus can begin quicker than when compared to previous systems. This is because when the substrate is loaded on (received by) the electrostatic clamp, a high thermal drift is observed. The time it takes for a substrate to reach a stable temperature in a prior art system may be 15-30 minutes. During the time when the temperature of the substrate is drifting towards thermal equilibrium, the substrate may be changing shape (e.g. expanding or contracting) which will affect the accuracy of any measurements being taken by the e-beam inspection apparatus. Thus, the substrate should be at a stable temperature for inspection of the substrate to be carried out.

A quicker speed of the substrate 402 reaching a stable temperature with the gas present in the volume 405 (i.e. the gas having been fed to the volume 405 via the conduit 416) means that the throughput of substrates 402 in the e-beam inspection apparatus 400 is increased. This is because e-beam inspection may begin quicker and so the overall time for e-beam inspection may be reduced. This may allow, for example, a multi-beam e-beam inspection apparatus to achieve a throughput of two substrates per hour, which was not possible previously.

In other examples, the article may not be a substrate and may be e.g. a patterning device (e.g. a mask or reticle). The patterning device may be for imparting a beam of radiation with a pattern in its cross-section. Similarly, in other examples, the article support may not be a substrate support and may be e.g. a support structure.

Although the above description has been concerned with an electrostatic clamp for attaching the substrate to the substrate table, in other examples, other types of clamp may be used, such as a mechanical clamp.

In other examples, the thermal conditioning of the article using the gas in the volume may not occur in the process chamber of the electron beam inspection apparatus but may occur in one or more transfer chambers. The transfer chamber is a vacuum chamber. The transfer chamber may include the article support and may be configured to transfer the article to or from a process chamber. The article may be passed through a series of transfer chambers in the electron beam inspection apparatus. In other examples, a transfer apparatus (such as a load-lock) may comprise a transfer chamber through which the article can enter the process chamber. The load-lock may be separate to the electron beam inspection apparatus.

In other examples, the vacuum chamber may not be part of an electron beam inspection apparatus but may be part of a different type of apparatus. For example, the vacuum chamber which encloses the article support, and where the thermal conditioning of the article using the gas occurs, may be part of a particle beam apparatus, an electron beam apparatus, a lithographic apparatus or any other suitable apparatus that includes a vacuum chamber and an article support. The particle beam apparatus may comprise a particle beam source which is analogous to the electron source of the electron beam inspection apparatus described above. The particle beam source may be for inspecting an article. The particle beam source may be for patterning an article.

The feeding of the gas via a conduit to provide the gas to the volume between the article and the article support such that the gas provides heat transfer between the article and the article support may occur in the vacuum chamber of any of these apparatus in a similar way as described above with respect to the e-beam inspection apparatus. Furthermore, the removal of the gas from the volume may also occur for any of these apparatus in a similar way as described above with respect to the e-beam inspection apparatus. More generally, the thermal conditioning of the article using the gas in the volume may occur in any vacuum chambers in a system.

Further embodiments may be described in the following clauses:

1. An apparatus comprising:
    a vacuum chamber for enclosing an article support;
        the article support configured to support an article such that a volume is defined between the article support and the article, the article support comprising a plurality of supporting protrusions configured to provide a plane of support for the article; and
        a conduit for providing a fluid to the volume such that the fluid provides heat transfer between the article and the article support,
    a controller for controlling the fluid supply to the volume;
    wherein the controller is configured to control the fluid supply to supply the fluid for a period of time substantially shorter than the time the article is supported by the article support.
2. The apparatus according to clause 1, wherein the vacuum chamber is a process chamber where the article is placed or a transfer chamber for transferring the article to a process chamber.
3. The apparatus according to any preceding clause, further comprising a pump for providing the fluid to the volume and/or for removing fluid from the volume.
4. The apparatus according to clause 3, wherein the pump is a first pump for pumping the fluid to the volume and a second pump for pumping the fluid from the volume.
5. The apparatus according to any preceding clause, wherein the fluid is a gas.
6. The apparatus according to any preceding clause, wherein the controller is configured to control the fluid supply to supply the fluid until the article reaches a stable temperature.
7. The apparatus according to any preceding clause, wherein the controller is configured to control the fluid supply to supply the fluid substantially immediately after the article is supported by the article support.
8. The apparatus according to any preceding clause, wherein the controller is configured to control the fluid supply such that fluid is removed from the volume for a specific period of time.
9. The apparatus according to any preceding clause, wherein the controller is configured to control the fluid supply to stop supplying the fluid and then to control the fluid supply such that fluid is removed from the volume.
10. The apparatus according to any preceding clause, wherein the article support comprises a clamp for clamping the article onto the support structure.
11. The apparatus according to clause 10, wherein the clamp is an electrostatic clamp or a mechanical clamp.
12. The apparatus according to any preceding clause, wherein the article is a patterning device or a lithographic substrate.
13. The apparatus according to any preceding clause, wherein the apparatus is one of a particle beam apparatus, an electron beam apparatus, an electron beam inspection apparatus, a lithographic apparatus or a transfer apparatus.
14. A method of performing thermal conditioning of an article in a vacuum chamber comprising:
    supplying fluid to a volume between the article and an article support which supports the article, the fluid providing heat transfer between the article and the article support, the article support comprising a plurality of supporting protrusions which provide a plane of support for the article;
    supplying the fluid for a period of time substantially shorter than the time the article is supported by the article support.
15. The method according to clause 14, further comprising supplying the fluid intermittently whilst the article is supported by the article support.

16. The method according to either of clauses 14 or 15, further comprising supplying the fluid until the article reaches a stable temperature.
17. The method according to any of clauses 14 to 16, further comprising supplying the fluid substantially immediately after the article is supported by the article support.
18. The method according to any of clauses 14 to 17, further comprising removing the fluid from the volume for a specific period of time.
19. The method according to any of clauses 14 to 18, further comprising removing the fluid from the volume after stopping the supplying of the fluid.
20. The method according to any of clauses 14 to 19, wherein the fluid is a gas.
21. The method according to clause 20, further comprising supplying the gas for a period between 1 minute and 2 minutes.
22. The method according to either of clauses 20 or 21, further comprising removing the gas from the volume for a period between 10 seconds and 20 seconds.
23. A lithographic apparatus comprising:
   a substrate table constructed to hold a substrate;
   wherein the apparatus of any of clauses 1 to 13 is comprised in and/or connected to the lithographic apparatus.
24. The lithographic apparatus of clause 23 comprising:
an illumination system configured to condition a radiation beam;
   a support structure constructed to support a patterning device, the patterning device being capable of imparting the radiation beam with a pattern in a cross-section of the radiation beam to form a patterned radiation beam;
   a projection system configured to project the patterned radiation beam onto the substrate.
25. A particle beam apparatus comprising:
a particle beam source;
a vacuum chamber for enclosing an article support;
   the article support configured to support an article such that a volume is defined between the article support and the article, the article support comprising a plurality of supporting protrusions configured to provide a plane of support for the article; and
   a conduit for providing a fluid to the volume such that the fluid provides heat transfer between the article and the article support.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc. In other examples, the lithographic apparatus may provide the pattern on the substrate using electron beam, x-ray or nano-imprint lithography. That is, the lithographic apparatus may be an electron beam, x-ray or nano-imprint apparatus.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference may be made in this text to embodiments of the invention in the context of an inspection apparatus, the object table may be suitable for use in: an electron beam apparatus, a scanning electron microscope, an electron beam direct writer, an electron beam projection lithography apparatus, an electron beam inspection apparatus, an electron beam defect verification apparatus, or an electron beam metrology apparatus.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. An apparatus comprising:
   a vacuum chamber to enclose an article support, the article support configured to support an article such that a volume is defined between the article support and the article, the article support comprising a plurality of supporting protrusions configured to provide a plane of support for the article;
   a conduit configured to provide a fluid to the volume such that the fluid provides heat transfer between the article and the article support; and
   a controller configured to control the fluid supply to the volume,
   wherein the controller is configured to control a fluid supply unit to start removing the fluid substantially at a time the article reaches a stable temperature.
2. The apparatus according to claim 1, wherein the stable temperature comprises a temporal and/or spatial temperature variation smaller than 1 K.

3. The apparatus according to claim 1, wherein the vacuum chamber is a process chamber where the article is placed or a transfer chamber to transfer the article to a process chamber.

4. The apparatus according to claim 1, wherein the fluid supply unit comprises a pump configured to provide the fluid to the volume and/or to remove fluid from the volume.

5. The apparatus according to claim 1, wherein the fluid is a gas or a liquid.

6. The apparatus according to claim 1, wherein the article support comprises a clamp configured to clamp the article onto the support structure.

7. The apparatus according to claim 1, wherein the article is a patterning device or a lithographic substrate.

8. The apparatus according to claim 1, wherein the apparatus is a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus or a transfer apparatus.

9. The apparatus according to claim 1, wherein the apparatus is a particle beam apparatus further comprising:
a particle beam generator configured to generate a particle beam to irradiate the article; and
a further controller configured to control the particle beam generator,
wherein the further controller is configured to control the particle beam generator to irradiate the particle beam to the article if a pressure inside the volume is below a specific value.

10. The apparatus according to claim 9, wherein the particle beam apparatus is an electron beam apparatus, the particle beam generator is an electron optical system, and the particle beam is an electron beam.

11. A method of performing thermal conditioning of an article in a vacuum chamber, the method comprising:
supplying fluid to a volume between the article and an article support in the vacuum chamber which supports the article, the fluid providing heat transfer between the article and the article support, the article support comprising a plurality of supporting protrusions which provide a plane of support for the article; and
starting to remove the fluid substantially at a time the article reaches a stable temperature.

12. The method according to claim 11, wherein the stable temperature comprises a temporal and/or spatial temperature variation smaller than 1 K.

13. The method according to claim 11, further comprising supplying the fluid intermittently while the article is supported by the article support.

14. The method according to claim 11, wherein the fluid is a gas or a liquid.

15. The method according to claim 11, further comprising irradiating the article with a particle beam generated by a particle beam generator responsive to a pressure inside the volume being below a specific value.

16. The method according to claim 11, wherein the vacuum chamber is part of a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus or a transfer apparatus.

17. The method according to claim 11, wherein the article is a patterning device or a lithographic substrate.

18. The apparatus according to claim 4, wherein the pump is a first pump configured to pump the fluid to the volume and a second pump configured to pump the fluid from the volume.

19. The apparatus according to claim 7, wherein the clamp is an electrostatic clamp or a mechanical clamp.

20. A particle beam apparatus comprising:
a particle beam source;
a vacuum chamber to enclose an article support, the article support configured to support an article such that a volume is defined between the article support and the article, the article support comprising a plurality of supporting protrusions configured to provide a plane of support for the article and a ring structure configured to contact the substrate when the substrate is supported by the protrusions and to close off the volume to an external environment in the vacuum chamber;
a conduit to provide a fluid to the volume such that the fluid provides heat transfer between the article and the article support; and
a controller configured to control the fluid supply to the volume.

* * * * *